(12) United States Patent
Jeon et al.

(10) Patent No.: US 7,498,244 B2
(45) Date of Patent: Mar. 3, 2009

(54) METHOD FOR FABRICATING GAN-BASED NITRIDE LAYER

(75) Inventors: Soo Kun Jeon, Gunsan-si (KR); Moon Sik Jang, Kwanju-si (KR)

(73) Assignees: Epivalley Co., Ltd., Kyunggi-do (KR); Samsung Electro-Mechanics Co., Ltd., Kyungki-do (KR)

( * ) Notice: Subject to any disclaimer, the term of this patent is extended or adjusted under 35 U.S.C. 154(b) by 456 days.

(21) Appl. No.: 10/543,318

(22) PCT Filed: Aug. 21, 2004

(86) PCT No.: PCT/KR2004/002114

§ 371 (c)(1),
(2), (4) Date: Jul. 25, 2005

(87) PCT Pub. No.: WO2005/053042

PCT Pub. Date: Jun. 9, 2005

(65) Prior Publication Data

US 2006/0154454 A1    Jul. 13, 2006

(30) Foreign Application Priority Data

Nov. 28, 2003    (KR) .................. 10-2003-0085334

(51) Int. Cl.
*H01L 21/36* (2006.01)

(52) U.S. Cl. .................. 438/483; 257/E21.097; 257/E32.117

(58) Field of Classification Search ............... 438/483, 438/46; 257/E21.085, E.097, E21.108, 257/E21.117, E21.118

See application file for complete search history.

(56) References Cited

U.S. PATENT DOCUMENTS

| 4,855,249 | A | 8/1989 | Akasaki et al. |
| 5,290,393 | A | 3/1994 | Nakamura |
| 6,242,764 | B1 | 6/2001 | Ohba et al. |
| 6,508,878 | B2 | 1/2003 | Kim et al. |
| 6,686,616 | B1 * | 2/2004 | Allen et al. .................. 257/280 |
| 2002/0069816 | A1 * | 6/2002 | Gehrke et al. .................. 117/84 |

FOREIGN PATENT DOCUMENTS

| JP | S62-119196 | 5/1987 |
| JP | 5-206513 A | 8/1993 |
| JP | H09-249499 | 9/1997 |
| JP | 2000-188260 A | 7/2000 |

* cited by examiner

Primary Examiner—W. David Coleman
(74) Attorney, Agent, or Firm—Husch Blackwell Sanders LLP

(57) ABSTRACT

The present invention relates to a method for fabricating a gallium nitride(GaN) based nitride layer including a step of forming a silicon carbide buffer layer on a substrate, a step of forming a wetting layer having a composition of $In(x1)Ga(y1)N$ ($0<x1\leq1$, $0\leq y1<1$, $x1+y1=1$) on the silicon carbide buffer layer, and a step of forming a nitride layer containing gallium and nitrogen on the wetting layer, thereby can implement an opto-electronic device of high efficiency and high reliability.

15 Claims, 4 Drawing Sheets

METHOD FOR FABRICATING GAN-BASED NITRIDE LAYER

TECHNICAL FIELD

The present invention relates to a method for fabricating a gallium nitride (GaN) based nitride layer. More particularly, the present invention relates to a method for fabricating a GaN-based nitride layer of a high quality using silicon carbide (SiC) buffer layer and a wetting layer.

BACKGROUND ART

In a process of manufacturing semiconductor devices, in order to grow a gallium nitride (GaN) based nitride layer, i.e., a GaN-based nitride layer, substrates composed of, usually, sapphire ($Al_2O_3$), silicon carbide (SiC), or the like have mainly been used. They are different from the GaN-based nitride layer in terms of their physical properties such as lattice constant and coefficient of thermal expansion. Thus, it is difficult to grow the GaN-based nitride layer of a high quality. Therefore, lots of schemes for growing the GaN-based nitride layer have been presented continually.

The most representative one includes a method of using a buffer layer. In this method, an $Al(x)Ga(y)In(z)N$ ($0 \leq x \leq 1$, $0 \leq y \leq 1$, $0 \leq z \leq 1$, $x+y+z=1$) layer is grown alone or through several combinations at a temperature ranging from 450° C. to 600° C. The growth of the $Al(x)Ga(y)In(z)N$ layer is stopped and the temperature is then increased. Then, $Al(x)Ga(y)In(z)N$ ($0 \leq x \leq 1$, $0 \leq y \leq 1$, $0 \leq z \leq 1$, $x+y+z=1$) that has been grown at a low temperature becomes nuclei. A GaN-based nitride layer of a high quality is grown using the nuclei as a seed. This buffer layer includes an AlN buffer layer (U.S. Pat. No. 4,855,249), an AlGaN buffer layer (U.S. Pat. No. 5,290,393), an AlInN buffer layer (U.S. Pat. No. 6,508,878) and the like.

However, although the GaN-based nitride layer is grown by this method, there is a problem in that the GaN-based nitride layer has a dislocation density of about $10^{10}$ to $10^{12}/cm^2$.

As an alternative, a buffer layer is not grown on a sapphire substrate at a low temperature as above, but a GaN-based nitride layer semiconductor is grown immediately on a substrate at a high temperature. However, this method has lots of room for improvement.

Meanwhile, researches on a method for growing silicon carbide (SiC) on a sapphire wafer have rarely been made. However, M. C. Luo demonstrated on his report that silicon carbide grown on (0001) sapphire has a 6H structure by means of Raman scattering measurement and X-Ray. Diffraction (XRD) analysis method. However, this experiment is directed to analysis into the structure of a formed silicon carbide layer, but not to a method for fabricating a GaN-based nitride layer having good physical properties on the silicon carbide layer.

Moreover, U.S. Pat. No. 6,242,764 discloses a method in which an AlGaN layer of a high quality is grown on a sapphire or silicon carbide substrate using a single crystalline silicon carbide layer at a high temperature (>1300° C.) as a buffer layer. As in the U.S. Pat. No. 6,242,764, however, if the single crystalline silicon carbide layer is grown on sapphire, mismatch rate becomes great between the two materials. Therefore, this method has disadvantages that a silicon carbide layer having a pretty high thickness (approximately 5 μm) is needed in order to grow the AlGaN layer of a high quality, and the thickly formed silicon carbide layer has a low adhesive strength with sapphire.

DISCLOSURE

Technical Problem

Accordingly, the present invention has been made in view of the above problems, and it is an object of the present invention to provide a method for growing a GaN-based nitride layer of a high quality on a non-single crystalline SiC buffer layer.

Another object of the present invention is to provide a method for growing a GaN-based nitride layer of a high quality by adding a wetting layer on a SiC buffer layer to enhance adhesion with the SiC buffer layer and the GaN-based nitride layer, and by optimizing the formation of the SiC buffer layer and the wetting layer.

Technical Solution

To achieve the above objects, according to the present invention, there is provided a method for fabricating a GaN-based nitride layer, including a first step of forming a non-single crystalline silicon carbide buffer layer having a thickness of 5 Å to 200 Å on a sapphire substrate, a second step of forming a wetting layer having a composition of $In(x1)Ga(y1)N$ ($0 \leq x1 \leq 1$, $0 \leq y1 < 1$, $x1+y1=1$) on the silicon carbide buffer layer, and a third step of forming a nitride layer comprising gallium and nitrogen on the wetting layer.

In order to form a silicon carbide layer used as a buffer layer, silicon and carbon are brought into reaction within a deposition apparatus. The silicon material or source may be $SiH_4$, $Si_2H_6$ or the like. The carbon material or source may include $CBr_4$, $CH_4$, etc. More specifically, $CBr_4$ or $C_xH_y$ (where x are y are integers), or a combination thereof may be used as a carbon precursor for growing the silicon carbide layer.

At this time, it is preferred that a growth temperature (T) of the silicon carbide layer is within a range of $600° C. \leq T \leq 990° C.$. If the temperature is too low, the silicon carbide layer itself cannot be formed.

It is preferred that the thickness of the silicon carbide buffer layer is 5 Å to 200 Å. If the thickness exceeds 200 Å, it may be difficult to control the shape of the GaN-based nitride layer that is grown on the silicon carbide buffer layer. Also, the adhesive strength with the sapphire substrate and the silicon carbide layer can be weakened.

In order to grow the GaN-based nitride layer, a variety of materials such as TMIn, TMGa, TMAl, $NH_3$ and hydrazine may be used. Although the materials of the thin layers as constituent elements of the present invention have been described particularly, it is to be noted that they are merely illustrative and the present invention is not restricted to those illustrated materials.

The wetting layer can be formed in a single layer having the same stoichiometric composition or in a combination of two or more layers having different stoichiometric composition.

It is preferable that the wetting layer is grown at a temperature of 400° C. to 900° C. A total thickness of the wetting layer is preferably 100 Å to 500 Å. If the growth temperature of the wetting layer is too high, it can be difficult to control the shape of the GaN-based nitride layer that is grown on the wetting layer.

It is preferred that the GaN-based nitride layer is grown at a temperature of 800° C. to 1200° C.

According to the present invention, there is provided a method for fabricating a GaN-based nitride layer in which the GaN-based nitride layer is grown above a substrate, including the step of forming a non-single crystalline silicon carbide buffer layer on the substrate prior to growing the GaN-based nitride layer.

According to the present invention, there is provided a method for fabricating a GaN-based nitride layer, including a first step of forming a silicon carbide buffer layer on a substrate, a second step of forming a wetting layer having a composition of $In(x1)Ga(y1)N$ ($0<x1\leq1$, $0\leq y1<1$, $x1+y1=1$) on the silicon carbide buffer layer, and a third step of forming a nitride layer including gallium and nitrogen on the wetting layer.

According to the present invention, there is provided a method for fabricating a GaN-based nitride layer in which the GaN-based nitride layer is grown above a substrate, including the step of forming a silicon carbide buffer layer on the substrate at a temperature of 600° C. to 990° C. prior to growing the GaN-based nitride layer.

According to the present invention, there is provided a method for fabricating a GaN-based nitride layer in which the GaN-based nitride layer is grown above a substrate, including the step of forming a silicon carbide buffer layer of 5 Å to 200 Å in thickness on the substrate prior to growing the GaN-based nitride layer.

Advantageous Effects

According to the present invention, a non-single crystalline SiC thin layer that has a material different from existing $Al(x)Ga(y)In(z)N$ ($0\leq x\leq1$, $0\leq y\leq1$, $0\leq z\leq1$, $x+y+z=1$) grown by means of a MOCVD method and is grown at a low temperature, is formed on a sapphire substrate as a buffer layer, or a wetting layer and a GaN layer is formed on the buffer layer. Therefore, a GaN layer having good physical properties can be formed. It is thus possible to implement an opto-electronic device of high efficiency and high reliability.

MODE FOR INVENTION

The present invention will now be described in detail in connection with preferred embodiments with reference to the accompanying drawings.

Generally, in order to grow a GaN-based nitride layer, substrates composed of sapphire ($Al_2O_3$), silicon carbide (SiC), or the like have mainly been used. Among them, the sapphire substrate is most frequently used due to its low price and good mechanical characteristics. Since the sapphire substrate has physical properties (lattice constant, coefficient of thermal expansion, etc.) different from the GaN-based nitride layer, it is difficult to grow a nitride layer of a high quality. As a result, the GaN-based nitride layer has a dislocation density of about $10^{10}$ to $10^{12}/cm^2$.

On the contrary, the lattice mismatch of lattice constant between silicon carbide (SiC) and gallium nitride (GaN) is 3.3%. This is significantly lower than 13.8%, which is the lattice mismatch of lattice constant between sapphire ($Al_2O_3$) and gallium nitride (GaN). Thus, in growing the GaN-based nitride layer on sapphire ($Al_2O_3$), silicon carbide (SiC) can be used as a good buffer layer, and the second embodiment of the present invention is based on such technological concept.

As in the second embodiment of the present invention, however, when a GaN layer is grown on a SiC buffer layer, various characteristics appear depending on the growth conditions (SiC growth temperature, GaN layer growth temperature, III/V ratio, etc.). In particular, if a GaN-based nitride layer, for example, a GaN layer is grown at a high temperature, the adhesive strength between SiC and GaN is not good. For this reason, it has been found that in an initial state, a continuous GaN layer is not evenly formed on the entire substrate but a discontinuous GaN layer exists. To combine the discontinuous GaN layer with the SiC buffer layer, the GaN layer must be grown to a significant thickness.

Therefore, in the first embodiment of the present invention, in order to enhance adhesion between the SiC buffer layer and the GaN-based nitride layer that will be grown on the SiC buffer layer, a wetting layer composed of $In(x1)Ga(y1)N$ ($0\leq x1\leq1$, $0\leq y1<1$, $x1+y1=1$) is employed. The appropriate growing condition was found by understanding that the characteristic of the GaN-based nitride layer formed on the wetting layer is greatly influenced by the growth conditions of the wetting layer.

In both comparative example and an embodiment below, a MOCVD method is employed and a sapphire substrate is used. The GaN layer is grown under the same condition in both cases.

FIRST COMPARATIVE EXAMPLE

Figure 3:
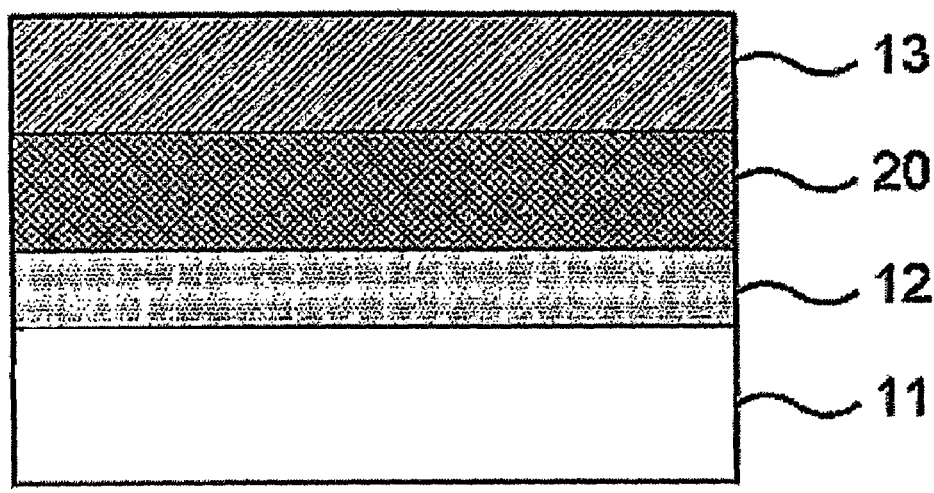
FIG. 3 is a view showing a method for forming a GaN layer according to a first comparative example.

FIG. 3 is a view showing a method for forming a GaN layer according to the first comparative example.

Referring to FIG. 3, a SiC buffer layer 12 is formed on a sapphire substrate 11. At this time, $SiH_4$ and $CBr_4$ are used as a source and a growth temperature of 900° C. is used. The growth temperature of the SiC buffer layer 12 is significantly lower than that (>1300° C.) of common single crystalline silicon carbide. While non-single crystalline silicon carbide is formed, mismatch between the sapphire substrate 11 and a wetting layer that will be described later on can be mitigated sufficiently.

Thereafter, a wetting layer 20 composed of $In_{0.02}Ga_{0.98}N$ is formed on the SiC buffer layer 12. At this time, TMIn, TMGa and $NH_3$ are used as sources and a growth temperature of 800° C. is used. Also, in the step of forming the wetting layer 20, the ratio of V-group element to III-group element (V/III ratio) is set to be within a range between 5000 and 6000.

Next, a GaN layer 13 is formed on the wetting layer 20. At this time, the growth condition of the GaN layer is the same as the typical one. At a temperature of approximately 800 to 1200° C., the V/III ratio is set to be within a range between 500 and 20,000.

Figure 4:
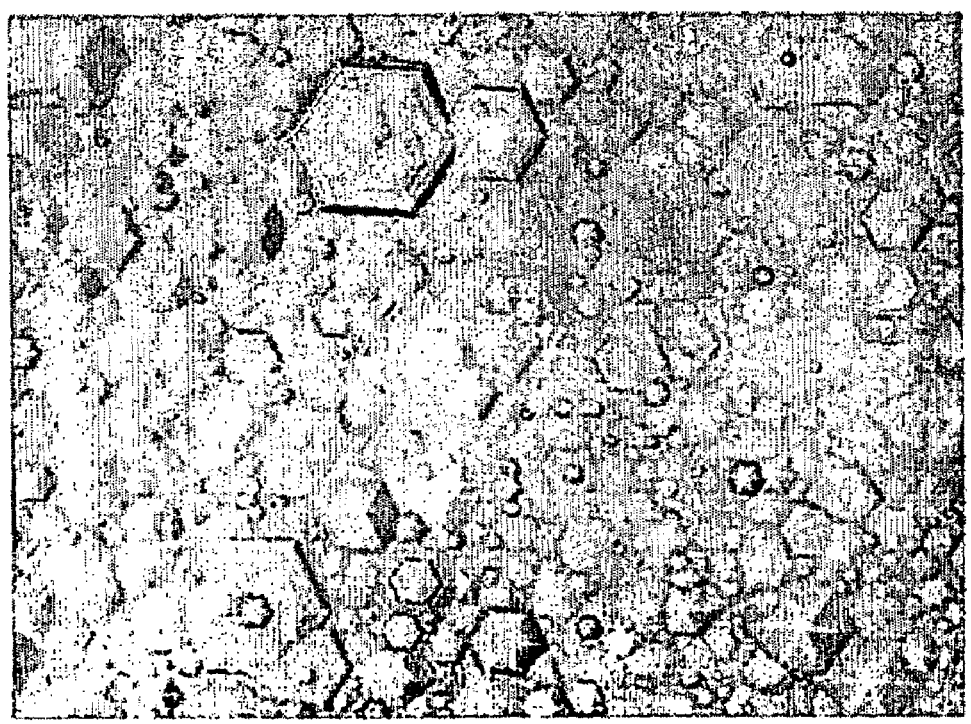
FIG. 4 is a view showing the shape of the surface of the GaN layer formed according to the first comparative example.

FIG. 4 shows the shape of the surface of the GaN layer that is formed by the method described with reference to FIG. 3. From FIG. 4, it can be seen that a problem is caused because lots of hillocks exist on the surface of the GaN layer 13 although a discontinuous GaN layer 13 is not formed. The reason these hillocks exist will be described as follows.

In order to obtain a GaN layer having a good surface like a mirror, it is required that a wetting layer be grown in a direction vertical to the growth direction of a thin layer at the early stage of growth. This means that III-group element and V-group element must move in the direction parallel to the growth surface and be then uniformly combined on the entire growth surface. If the amount of the V-group element becomes too much, the III-group element does not have the time for moving uniformly onto the entire growth surface and is mainly grown in the direction vertical to the substrate, thus causing hillocks to occur. Therefore, if the amount of the V-group element is reduced, the III-group element can have the time for moving uniformly onto the entire growth surface. Therefore, a GaN layer having a good surface like a mirror can be obtained. The mobility for moving in the lateral direction on the surface can vary depending on Ga, In, Al and a combination thereof, i.e., according to the type of the III-group elements, so that the growth condition for securing a sufficient plane mobility speed is affected by the components of the wetting layer. Accordingly, AlN can have a flatter surface at a high temperature when it has a lower V/III ratio.

First Embodiment

The structure of the first embodiment according to the present invention is formed by almost the same method as that described in the first comparative example. That is, all process steps and conditions are the same as those of the first comparative example except that in the step of forming the wetting layer 20, the V/III ratio is set to a range between 250 and 300, which is 1/20 lower than that of the first comparative example. As such, the structure according to the first embodiment of the present invention is the same as that shown in FIG. 3. Thus, description on it will be omitted in order to avoid redundancy of explanation.

Figure 5:
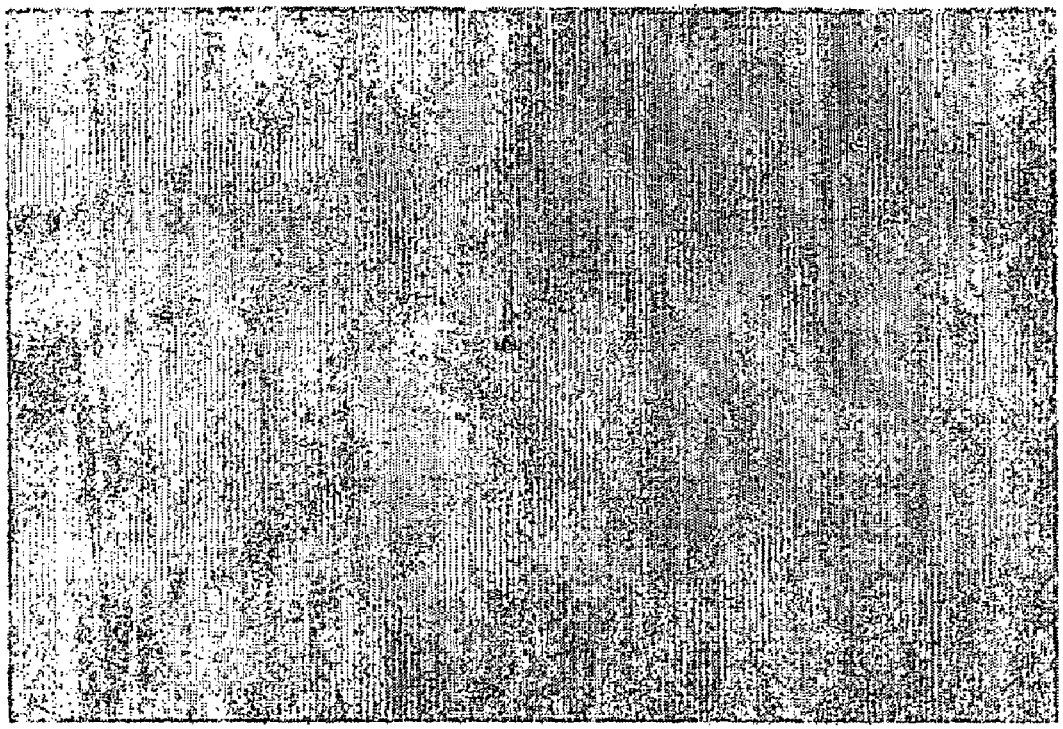
FIG. 5 is a view showing the shape of the surface of the GaN layer formed by the method according to a first embodiment of the present invention.

FIG. 5 is a view showing the shape of the surface of the GaN layer formed by the method of the first embodiment according to the present invention. From FIG. 5, it can be seen that hillocks that can be seen in FIG. 4 almost disappear and a good surface like a mirror is obtained.

Through the results of the first embodiment, it can be seen that the V/III ratio is set to a range from 1 to 5000 in the step of forming the wetting layer 20 and it is preferred that the V/III ratio is lower than the V/III ratio, which is causes hillocks to occur in the GaN layer 13.

SECOND COMPARATIVE EXAMPLE

Figure 6:
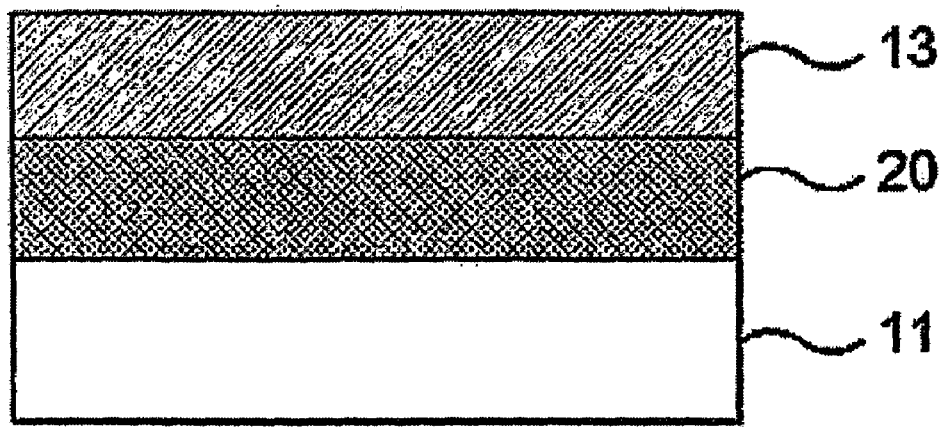
FIG. 6 is a view showing a method for forming a GaN layer according to a second comparative example.
Figure 7:
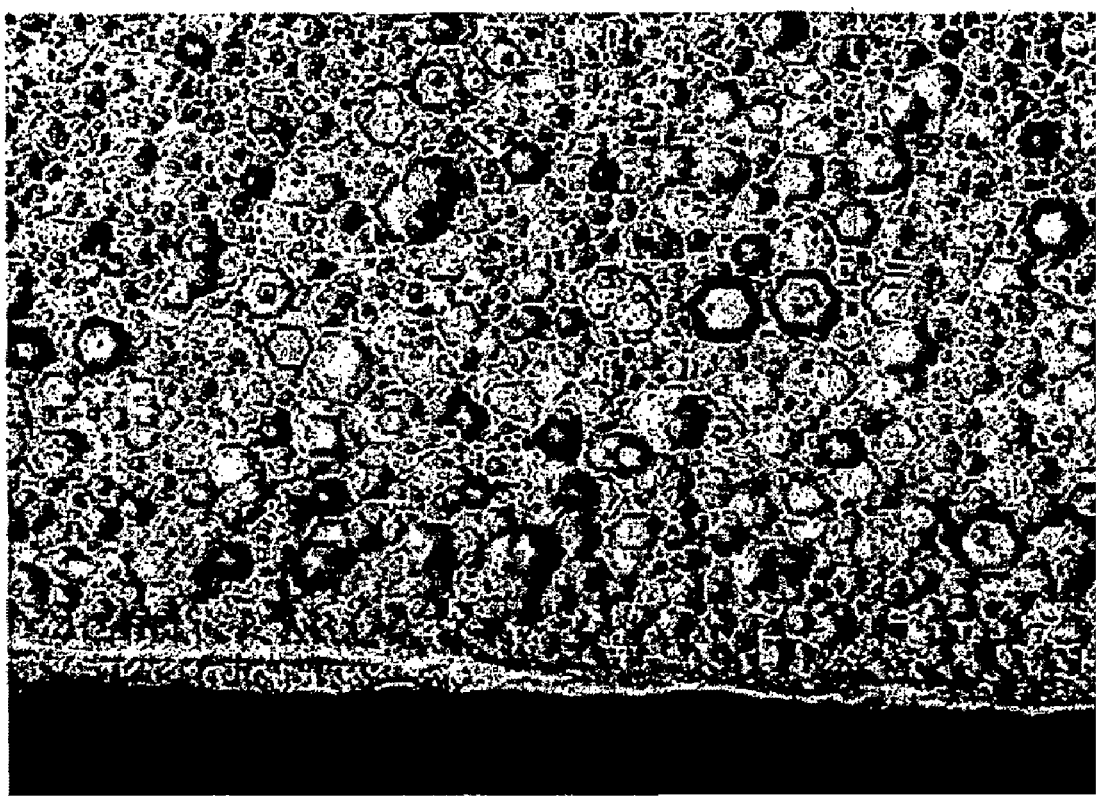
FIG. 7 is a view showing the shape of the surface of a GaN layer formed by a method of the second comparative example.

The second comparative example is intended to determine the effect of the SiC buffer layer. The structure of the second comparative example is formed by almost the same method as the first embodiment. That is, all process steps and conditions are the same as those of the first embodiment except that the SiC buffer layer is not formed. FIG. 6 shows the structure of the second comparative example. FIG. 7 shows the shape of the surface of the GaN layer formed by the method according to the second comparative example.

From FIG. 7, it can be seen that the flat surface shown in FIG. 5 is changed to a surface that is filled with very dense hillocks as formation of the SiC buffer layer is omitted. This is because the SiC buffer layer serves to mitigate mismatch among the sapphire substrate and the wetting layer, and the GaN layer formed thereon.

Second Embodiment

Figure 1:
FIG. 1 is a view showing a second embodiment of the present invention.

FIG. 1 is a view showing the second embodiment of the present invention. As shown in FIG. 1, after a SiC buffer layer 12 has been formed on a sapphire substrate 11, a GaN layer 13 is grown immediately on the SiC buffer layer 12 at a high temperature of 900° C. or more.

Figure 2:
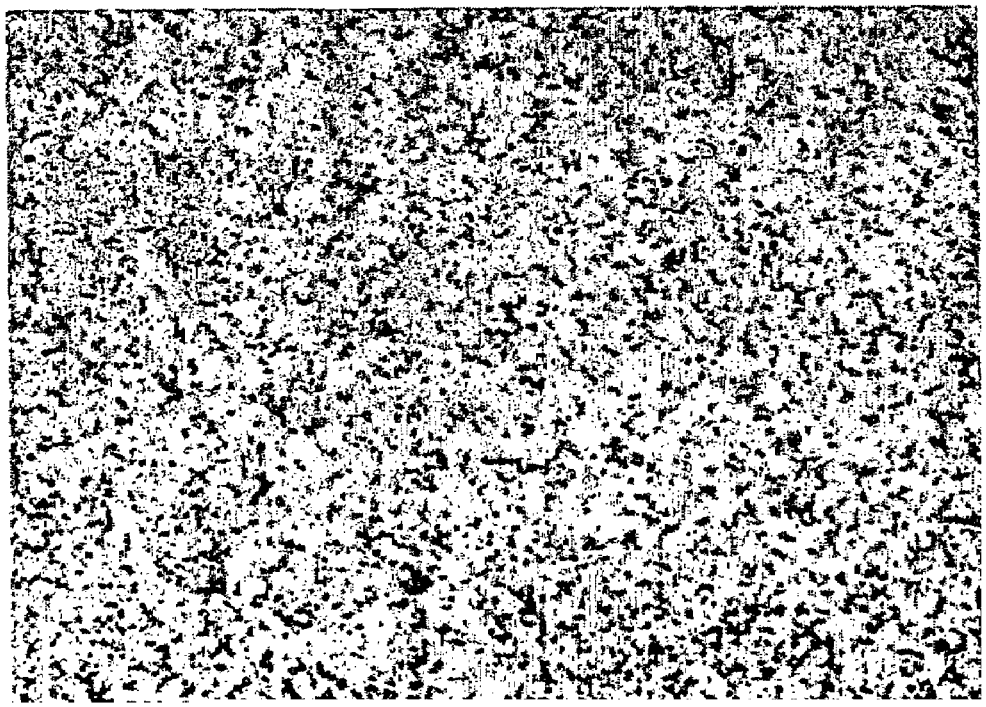
FIG. 2 is a view showing the surface of a GaN layer 13 immediately after it has been grown by the method described with reference to FIG. 1.

FIG. 2 is a view showing the surface of the GaN layer 13 immediately after it has been grown by the method described with reference to FIG. 1. Since the adhesive strength between SiC and GaN is not good, a continuous GaN layer is not formed, but only a discontinuous GaN layer 13 is formed. Therefore, in this case, it is necessary to grow a GaN layer 13 having a thickness enough to overcome such discontinuousness.

The invention claimed is:

1. A method for fabricating a GaN-based nitride layer including:
   a first step of forming a non-single crystalline silicon carbide buffer layer having a thickness of 5 Å to 200 Å on a sapphire substrate;
   a second step of forming a wetting layer having a composition of $In(x1)Ga(y1)N$ ($0 \leq x1 \leq 1$, $0 \leq y1 < 1$, $x1+y1=1$) on the silicon carbide buffer layer; and
   a third step of forming a nitride layer comprising gallium and nitrogen on the wetting layer.

2. The method for fabricating a GaN-based nitride layer of claim 1, wherein in the first step, at least one of $CBr_4$ or $C_xH_y$ (where x are y are integers) is used as a carbon precursor.

3. The method for fabricating a GaN-based nitride layer of claim 1, wherein the growth temperature (T) of the silicon carbide buffer layer is within a range of $600° C. \leq T < 990° C.$ 4. The method for fabricating a GaN-based nitride layer of claim 1, wherein the wetting layer is formed in a single layer.

5. The method for fabricating a GaN-based nitride layer of claim 1, wherein the wetting layer is formed in a combination of two or more layers.

6. The method for fabricating a GaN-based nitride layer of claim 1, wherein the growth temperature of the wetting layer is within a range of 400° C. to 900° C.

7. The method for fabricating a GaN-based nitride layer of claim 1, wherein the wetting layer has a thickness of 100 Å to 500 Å.

8. The method for fabricating a GaN-based nitride layer of claim 1, wherein in the second step, the V/III ratio has a value and the value is within a range of 1 to 5000 and is lower than a V/III ratio causing hillocks to occur in the nitride layer.

9. The method for fabricating a GaN-based nitride layer of claim 1, wherein the nitride layer is made of a combination of two or more layers.

10. The method for fabricating a GaN-based nitride layer of claim 1, wherein the growth temperature of the nitride layer is within a range of 800° C. to 1200° C.

11. The method for fabricating a GaN-based nitride layer of claim 1, wherein in the third step, the V/III ratio has a value of 500 to 20000.

12. A method for fabricating a GaN-based nitride layer above a substrate, the method comprising:
    a step of forming a non-single crystalline silicon carbide buffer layer on the substrate prior to growing the GaN-based nitride layer; and
    a step of forming a wetting layer having a composition of $In(x1)Ga(y1)N$ ($0 \leq x1 \leq 1$, $0 \leq y1 < 1$, $x1+y1=1$) on the silicon carbide buffer layer prior to growing the GaN-based nitride layer.

13. A method for fabricating a GaN-based nitride layer including:

a first step of forming a silicon carbide buffer layer on a substrate;

a second step of forming a wetting layer having a composition of $In(x1)Ga(y1)N$ ($0<x1\leqq1$, $0\leqq y1<1$, $x1+y1=1$) on the silicon carbide buffer layer at a first temperature; and a third step of forming a nitride layer containing gallium and nitrogen on the wetting layer at a temperature higher than the first temperature.

14. method for fabricating a GaN-based nitride layer above a substrate, the method comprising:

a step of forming a silicon carbide buffer layer on the substrate at a temperature of 600° C. to 990° C. prior to growing the GaN-based nitride layer; and a step of forming a wetting layer having a composition of $In(x1)Ga(y1)N$ ($0\leqq x1\leqq1$, $0\leqq y1<1$, $x1+y1=1$) on the silicon carbide buffer layer prior to growing the GaN-based nitride layer.

15. A method for fabricating a GaN-based nitride layer above a substrate, the method comprising:

a step of forming a silicon carbide buffer layer of 5 Å to 200 Å in thickness on the substrate prior to growing the GaN-based nitride layer; and a step of forming a wetting layer having a composition of $In(x1)Ga(y1)N$ ($0\leqq x1\leqq1$, $0\leqq y1<1$, $x1+y1=1$) on the silicon carbide buffer layer prior to growing the GaN-based nitride layer.

* * * * *